United States Patent [19]

Kitano

[11] Patent Number: 4,611,303
[45] Date of Patent: Sep. 9, 1986

[54] WORD-LINE DISCHARGING CIRCUIT IN A STATIC-TYPE SEMICONDUCTOR MEMORY DEVICE

[75] Inventor: Kouichi Kitano, Tokyo, Japan

[73] Assignee: Fujitsu Limited, Kawasaki, Japan

[21] Appl. No.: 469,823

[22] Filed: Feb. 25, 1983

[30] Foreign Application Priority Data

Feb. 27, 1982 [JP] Japan ................................. 57-29796

[51] Int. Cl.⁴ ............................................. G11C 11/40
[52] U.S. Cl. ..................................... 365/230; 365/190; 365/179
[58] Field of Search ............... 365/203, 242, 190, 189, 365/204, 174, 155, 179, 230

[56] References Cited

U.S. PATENT DOCUMENTS

| | | | |
|---|---|---|---|
| 4,156,941 | 5/1979 | Homma et al. | 365/189 |
| 4,168,490 | 9/1979 | Stinehelfer | 365/204 |
| 4,369,502 | 1/1983 | Isogai | 365/190 |
| 4,370,736 | 1/1983 | Takahashi | 365/190 |
| 4,393,476 | 7/1983 | Ong | 365/203 |
| 4,463,448 | 7/1984 | Sugo et al. | 365/190 |
| 4,520,462 | 5/1985 | Yamada et al. | 365/203 |

Primary Examiner—James W. Moffitt
Assistant Examiner—Glenn A. Gossage
Attorney, Agent, or Firm—Staas & Halsey

[57] ABSTRACT

A word-line discharging circuit in a static-type semiconductor memory device, including, for each word line, a first transistor for detecting the potential change of the word line, a time-constant circuit for delaying the output of the first transistor, and a second transistor for conducting a discharging current through the memory cells. The second transistor is switched in response to the output of the time-constant circuit, and includes, for all of the word lines, a common discharging current source. The word-line discharging circuit further includes means respectively provided between the word lines and the common discharging current source for respectively slowing the rate of change in the current flowing through the word lines, whereby double selection of the word lines is prevented.

4 Claims, 7 Drawing Figures

WORD-LINE DISCHARGING CIRCUIT IN A STATIC-TYPE SEMICONDUCTOR MEMORY DEVICE

BACKGROUND OF THE INVENTION (1) Field of the Invention

The present invention relates to a word-line discharging circuit in a static-type semiconductor memory device of, for example, an emitter-coupled logic device, an integrated injection logic device, and so forth, using bipolar transistors.

(2) Description of the Prior Art

Generally, in the above-mentioned static-type semiconductor memory device, memory cells in one row are connected between a word line and a hold line. In order to hold the memory status, i.e., the status of the flip-flop, of each memory cell, a holding current flows from the word line through the memory cell and the hold line to a holding current source. The selection of the word line is effected by boosting the electric potential of the word line using a word driver. In this case, since the word driver is an emitter follower, the time for changing the word line from an unselected state to a selected state, that is, the rise time of the word line, is short. However, the time for changing the word line from a selected state to an unselected state, that is, the fall time of the word line, depends on the amount of charge stored in the parasitic capacitances of the word line and on the amount of holding current. This is because the emitter follower, i.e., the word driver, is cut off during the fall time. However, recently, semiconductor memory devices of large scale and low power consumption have been developed. Accordingly, the amount of holding current is becoming smaller so that the fall time of the word line tends to become long.

In order to shorten the fall time of the above-mentioned word line, a word-line discharging circuit has been employed for conducting a concentrated discharge current through the word line which is transferred from a selected state to an unselected state. That is, for conducting a discharge current, in addition to the regular holding current, through the above-mentioned word line, and for keeping the discharging current flowing through the above-mentioned word line for a certain time period.

A conventional word-line discharging circuit comprises, for each word line, a first transistor which is an emitter follower and which is switched in response to the electric potential of the word line, a time-constant circuit consisting of a first resistor and a capacitor, a second transistor switched by the output of the time-constant circuit, and a second resistor connected between the base of the second transistor and a common bias-current source. The second transistor has a collector connected to the corresponding hold line and an emitter directly connected to a common discharging current source. Therefore, the second transistors provided between the common discharging current source and the respective word lines constitute a current switch. That is, when a certain word line transfers from an unselected state to a selected state, the first transistor turns on and then after a time constant determined by the resistor and the capacitor of the time-constant circuit, the second transistor turns on so that the current flowing through the selected word line and the memory cells connected to the word line is increased by the current from the common discharging current source in addition to the regular holding current. Simultaneous with the transfer of the above-mentioned word line to the selected state, another word line transfers from a selected state to an unselected state so that the first transistor of the corresponding word line is turned off, and until the charges stored in the capacitor of the time-constant circuit are discharged through the second resistor, the discharging current from the common discharging current source is held. Therefore, the charges on the word line which has been changed to the unselected state are rapidly decreased so that the fall time of the word line is shortened.

In the above-described conventional circuit, a problem exists in that, along with the recent miniaturization and the development of a large-scale memory-cell structure, the amount of holding current flowing through the memory cells tends to become small. Also, along with the decrease in the current flowing from the word line through the memory cells to the word-line discharging circuit, the phenomenon of decreasing junction capacitance in the memory cell occurs. Therefore, when a word line transfers from a selected state to an unselected state, the value of the current flowing through the memory cell after the word-line potential falls is smaller than before the word-line potential falls. Thus, the amount of charge which can be stored in the memory cell is decreased after the word-line potential falls. As a result, after the word-line potential falls, the charges stored in the memory cell before the word-line potential falls, overflow to the word line so that the word-line potential is raised again. Thus, conventionally, there has been the problem of the phenomenon of double selection, in which the selected word line is again selected when the word line changes from a selected state to an unselected state.

SUMMARY OF THE INVENTION

In view of the problem in the above-described prior art, an object of the present invention is based on the idea of providing means for slowing the rate of change in the current flowing through the word line between each of the word lines and the common discharging current source to prevent double selection of the word lines and to ensure the selection of a memory cell.

In order to attain the above object, there is provided a word-line discharging circuit in a static-type semiconductor memory device, the static-type semiconductor memory device including a plurality of word lines and hold line pairs; a plurality of memory cells connected between each of the word line and hold line pairs and a plurality of holding current sources, respectively connected between respective hold lines and a voltage source, for continually drawing holding currents from the word lines through the memory cells to the hold line. The word-line discharging circuit includes first transistors having bases, respectively connected to the word lines, for detecting changes in the electric potentials of the respective word lines; time-constant circuits for delaying the output of the first transistors; a common discharging current source; and second transistors respectively inserted between the hold lines and the common discharging current source. The second transistors are switched, respectively in response to the output of the time-constant circuit. The word-line discharging circuit further includes means, respectively provided between the word lines and the common discharging current source, for slowing the rate of change in the current flowing through the word lines.

According to one aspect of the present invention, the second transistors are NPN transistors each having a collector connected to the corresponding hold line, a base connected to the output of the corresponding time-constant circuit, and an emitter. The means for blunting changes in the current flowing through the word lines being a resistor connected between the emitter of each of the second NPN transistors and the common discharging current source.

According to another aspect of the invention, the second transistors are NPN transistors each having a collector connected to the corresponding hold line, an emitter connected to the common discharging current source, and a base. The means for slowing the rate of change in the current flowing through the word lines is a resistor connected between the base of each of the second NPN transistors and the output of the corresponding time-constant circuit.

According to still another aspect of the invention, the first transistors are PNP transistors each having an emitter connected to the corresponding word line and a base and a collector connected to each other. The means for slowing down the rate of change in the current flowing through the word lines is the first PNP transistors.

According to a further aspect of the invention, the second transistors are NPN transistors each having an emitter connected to the corresponding hold line, a collector connected to the common discharging current source, and a base connected to the output of the corresponding time-constant circuit. The means for slowing down the rate of change in the current flowing through the word lines is the second NPN transistor.

BRIEF DESCRIPTION OF THE DRAWINGS

The above object and other objects and features of the present invention will be more apparent from the following description of the embodiments made with reference to the accompanying drawings, wherein.

DESCRIPTION OF THE PREFERRED EMBODIMENTS

The embodiments of the present invention will be explained with reference to the drawings.

Figure 1:
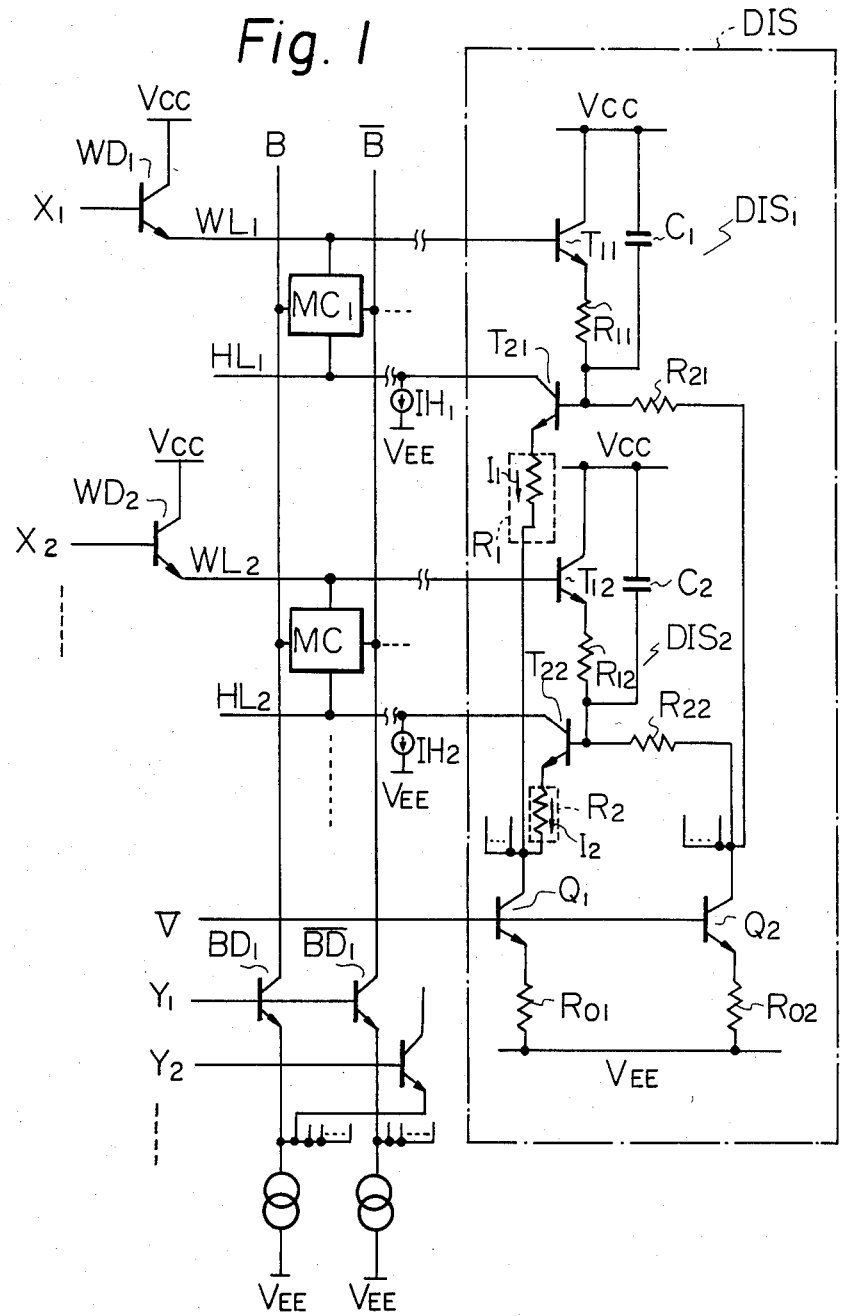
FIG. 1 is a circuit diagram of a static-type semiconductor memory device according to an embodiment of the present invention.

FIG. 1 is a circuit diagram of a main portion of a static-type semiconductor memory device, according to an embodiment of the present invention. In FIG. 1, $MC_1$, $MC_2$, ..., are flip-flop-type memory cells; $WL_1$, $WL_2$, ..., are word lines; $HL_1$, $HL_2$, ..., are hold lines; B and $\overline{B}$ are a pair of bit lines; $WD_1$ and $WD_2$ are word drivers for driving the word lines $WL_1$ and $WL_2$, respectively; $BD_1$ and $\overline{BD}_1$ are bit drivers for driving the bit lines B and $\overline{B}$; and $IH_1$, $IH_2$, ..., are holding current sources respectively connected between the hold lines and a negative voltage source $V_{EE}$. The memory cells $MC_1$, $MC_2$, ..., are arranged in a matrix so as to construct a memory cell array MCA. The other memory cells, word drivers, and bit drivers are not illustrated for the sake of simplicity. One memory cell, for example, $MC_1$, is selected by turning on one of the word drivers, e.g., $WD_1$, and one pair of bit drivers, e.g., $BD_1$ and $\overline{BD}_1$. Row address signals $X_1$, $X_2$, ..., have a high potential "H" during a selected state so as to turn on the corresponding word driver. Column address signals $Y_1$, $Y_2$, ..., have a high potential "H" during a selected state so as to turn on the corresponding pair of bit drivers. DIS is a word-line discharging circuit comprising terminating circuits $DIS_1$, $DIS_2$, ..., each of which is connected to the end of a word line and to the end of a hold line. The terminating circuit $DIS_1$ will now be explained. The other terminating circuits $DIS_2$, $DIS_3$, ..., have configurations similar to the configuration of the terminating circuit $DIS_1$. The terminating circuit $DIS_1$ comprises a first transistor $T_{11}$ of an emitter follower having a base connected to the word line $WL_1$, a time-constant circuit consisting of a resistor $R_{11}$ and a capacitor $C_1$ for delaying the emitter output of the transistor $T_{11}$, a second transistor $T_{21}$ having a base for receiving the output of the time-constant circuit and having a collector connected to the hold line $HL_1$, which is turned on (so as to be conductive) or off (so as to be non-conductive) depending upon the output of the time-constant circuit, and a resistor $R_{21}$ connected between the base of the second transistor and a common bias current source consisting of a transistor $Q_2$ and a resistor $R_{02}$. A transistor $Q_1$ and a resistor $R_{01}$ comprise a common current source for discharging the charges on the word lines. By continually applying a constant voltage V to the bases of the transistors $Q_1$ and $Q_2$, a discharging current is forced to flow through a word line which is later transferring from a selected state to an unselected state, as is described in detail.

Conventionally, the emitters of the second transistors $T_{21}$, $T_{22}$, ..., are directly connected to the collector of the transistor $Q_1$, which, along with the resistor $R_{01}$, constitutes the common current source for discharging the charges on the word lines. However, in this embodiment, the emitters of the second transistors $T_{21}$, $T_{22}$, ..., are connected via resistors $R_1$, $R_2$, ..., to the second common current source.

Figure 2A:
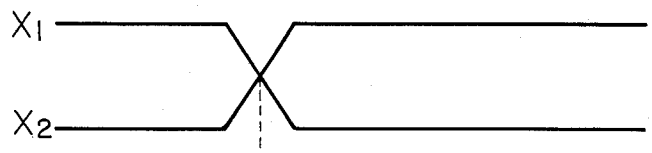
FIG. 2A is a waveform diagram of the potential changes of the row address signals applied to the static-type semiconductor device of FIG. 1.
Figure 2B:
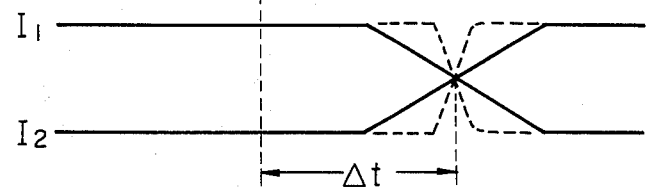
FIG. 2B is a waveform diagram of the changes in the current flowing through the word-line discharging circuit in the device of FIG. 1.
Figure 2C:
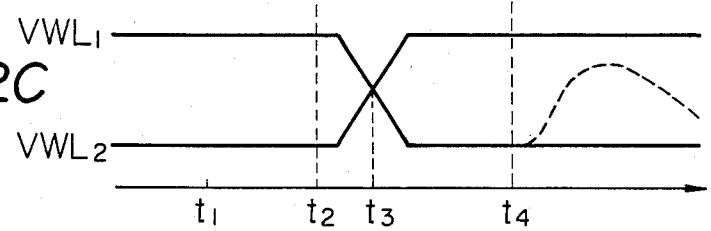
FIG. 2C is a waveform diagram of the potential changes of the word lines in the device of FIG. 1.

The operation of the circuit of FIG. 1 will now be explained with reference to FIGS. 2A through 2B. FIG. 2A is a waveform diagram of the electric potential changes of the row address signals $X_1$ and $X_2$. FIG. 2B is a waveform diagram of the changes in the current flowing through the emitters of the second transistors $T_{21}$ and $T_{22}$, the currents being changed in response to the switching of the electric potentials of the row address signals $X_1$ and $X_2$. FIG. 2C is a waveform diagram of the changes in the electric potential of the word lines $WL_1$ and $WL_2$. At a time $t_1$, the row address signal $X_1$ is at the "H" level and the row address signal $X_2$ is at the L level, and, therefore, the word line $WL_1$ is in a selected state and the word line $WL_2$ is in an unselected state. At this time, the first transistor $T_{11}$ and the second transistor $T_{21}$ in the terminating circuit $DIS_1$ are both conductive so that, as is illustrated in FIG. 2B, a large current $I_1$ flows from the word line $WL_1$ through the selected-state memory cell $MC_1$, the hold line $HL_1$, the second transistor $T_{21}$, and the resistor $R_1$ to the common discharging current source consisting of the transistor $Q_1$ and the resistor $R_{01}$. Also, a first transistor $T_{12}$ and the second transistor $T_{22}$ in the terminating circuit $DIS_2$ are both non-conductive so that only a small current $IH_2$ flows from the unselected word line $WL_2$ through the memory cells, e.g., $MC_2$, connected in this row, to the holding current source $IH_2$. At the time $t_1$, the potential of the word line $WL_1$ is at the "H" level and the potential of the word line $WL_2$ is at the "L" level, as is illustrated in FIG. 2C.

At a time $t_2$, when the potentials of the row address signal $X_1$ and $X_2$ are switched, the word driver $WD_1$ is turned off and the word driver $WD_2$ is turned on so that at a time $t_3$ slightly later than the time $t_2$, the potential of the word line $WL_1$ is switched to the "L" level and the potential of the word line $WL_2$ is switched to the "H" level. Also, in response to the switching of the word line $WL_1$ from the "H" level to the "L" level, the first transistor $T_{11}$ in the terminating circuit $DIS_1$ is turned off. However, the second transistor $T_{21}$ in the terminating circuit $DIS_1$ is not turned off until a time constant $\Delta t$ determined by the time-constant circuit, comprising the resistor $R_{11}$ and the capacitor $C_1$, has passed because the change in the potential at the emitter of the first transistor $T_{11}$ is transferred to the base of the second transistor $T_{21}$ only after the above-mentioned time constant $\Delta t$.

Therefore, even after the potential of the word line $WL_1$ is switched to the "L" level, a discharging current continues to flow through the word line $WL_1$ until a time $t_4$, which is later than the time $t_3$, so that the charges stored in the floating capacitors included in the hold line $HL_1$ and the memory cells, e.g., $MC_1$, connected in this row are discharged to accelerate the lowering of the potential of the word line $WL_1$. On the other hand, in the terminating circuit $DIS_2$, in response to the row address signal $X_2$, which is switched at the time $t_2$ from an unselected state to a selected state, the potential of the word line $WL_2$ rises. After the transistor $T_{12}$ is turned on so as to be conductive, the second transistor $T_{22}$ begins to be conductive at the time $t_4$, which is later than the time $t_3$, due to the resistor $R_{12}$ and the capacitor $C_2$. Only after the time $t_4$ does the current $I_2$ from the common discharging current source flow through the word line $WL_2$, which has been turned on so as to be in a selected state.

Conventionally, the resistor $R_1$ or $R_2$ is not connected between the emitter of the second transistor and the common discharging current source. Therefore, as is illustrated by the broken curves in FIG. 2B, the current $I_2$ flowing through the word line $WL_1$, which is changed from a selected state to an unselected state, is rapidly decreased. Due to the rapid decrease of the current, the charges stored in the memory cells flood out onto the word line $WL_1$, resulting in a phenomenon in which the potential of the word line $WL_1$, which has been turned off so as to be in the unselected state, is raised again, as is illustrated by the dotted curve in FIG. 2C. This phenomenon can be explained by the fact that the floating capacitance of the PN junctions in the memory cell is rapidly decreased due to the rapid decrease of the current flowing therethrough. Accordingly, double selection inconveniently occurs in the conventional art.

In this embodiment, by inserting the resistors $R_1$, $R_2$, ..., between the respective emitters of the second transistors $T_{21}$, $T_{22}$, ..., and the collector of the transistor $Q_1$ in the common discharging current source, the rate of change of the discharging current flowing through the word lines $WL_1$, $WL_2$, ..., or through the emitters of the second transistors $T_{21}$, $T_{22}$, ..., is slowed down, as is illustrated by the solid curves in FIG. 2B. This slowing effect can be obtained, as can easily be seen by those skilled in the art, due to the current-limiting effect of the resistors $R_1$, $R_2$, .... As a result, the floating capacitance of the PN junctions in the memory cell is gradually decreased due to the gradual change of the word line. Therefore, the potential of the word line, which has been turned off so as to be in the unselected state, is not increased again unless the word line is switched on so as to be in a selected state. Thus, the problem of double selection is solved.

Figure 3:
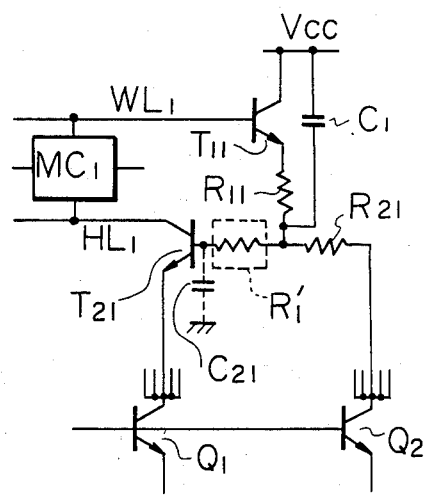
FIGS. 3 through 5 are circuit diagrams of the word-line discharging circuits according to other embodiments of the present invention.
Figure 4:
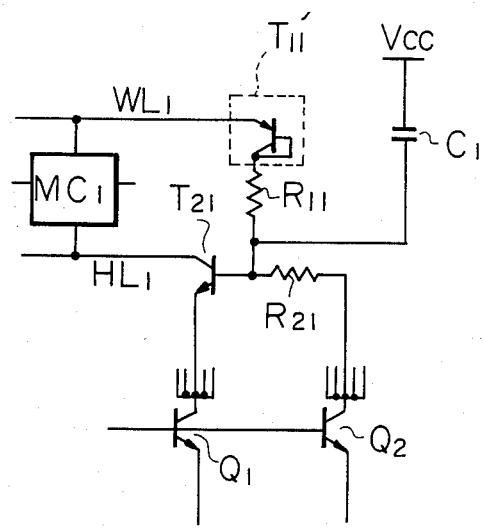
Figure 5:
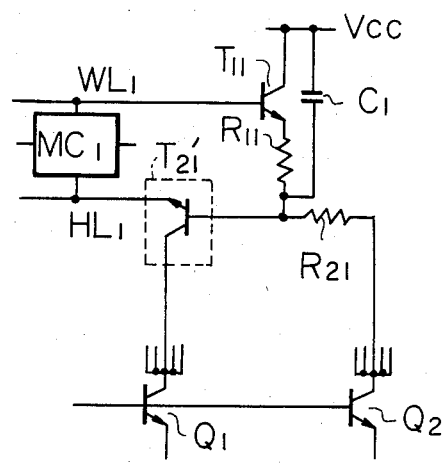

FIGS. 3 through 5 are circuit diagrams of main portions of word-line discharging circuits, according to other embodiments of the present invention, respectively. In FIGS. 3 through 5, only terminating circuits corresponding to the terminating circuit $DIS_1$ in FIG. 1 are illustrated in detail. The other terminating circuits are similar to the terminating circuits of FIGS. 3 through 5 and, therefore, are not illustrated for the sake of simplicity. In FIG. 1, as means for slowing the rate of the change in the current flowing through the word line, the resistor $R_1$ or $R_2$, is inserted between the emitter of the second transistor $T_{21}$ or $T_{22}$ and the collector of the transistor $Q_1$ comprising, along with the resistor $R_{01}$, the common discharging current source. However, in FIG. 3, in place of the resistor $R_1$ or $R_2$, a resistor $R_1'$ is inserted between the base of the second transistor $T_{21}$ and a common connecting point of the resistor $R_{11}$ and the capacitor $C_1$, which form the time-constant circuit. By inserting the resistor $R_1'$ between the output of the time-constant circuit and the base of the second transistor $T_{21}$, as mentioned above, the frequency characteristics of the second transistor $T_{21}$ can be equivalently deteriorated because the second transistor $T_{21}$ has at its base a parasitic capacitance $C_{21}$, resulting in effects similar to those in the circuit of FIG. 1. A third embodiment is illustrated in FIG. 4.

In FIG. 4, in place of the first NPN transistor $T_{11}$ in FIG. 1 for detecting a change in the potential of the word line $WL_1$, a PNP transistor $T_{11}'$, having a base and a collector connected to each other and an emitter connected to the word line $WL_1$, is employed. Since the carriers in the PNP transistor $T_{11}'$ are holes which have a lower mobility than the electrons which act as carriers in the NPN transistor $T_{11}$, the frequency characteristics of the PNP transistor $T_{11}'$ can be deteriorated in comparison with the frequency characteristics of the NPN transistor $T_{11}$ in FIG. 1. This third embodiment also results in effects similar to those in the circuit of FIG. 1.

A fourth embodiment is illustrated in FIG. 5. In FIG. 5, in place of the second NPN transistor $T_{21}$ in FIG. 1, an NPN transistor $T_{21}'$ is employed. The NPN transistor $T_{21}'$ has an emitter connected to the hold line $HL_1$ and a collector directly connected to the discharging current source, i.e., not connected via a resistor. That is, the collector and the emitter of the transistor $T_{21}$ in FIG. 1 are interchanged so as to realize the transistor $T_{21}'$. Due to this connection, the response speed of the NPN transistor $T_{21}'$ at a high frequency is deteriorated, resulting in effects similar to those in the circuit of FIG. 1.

The present invention is not restricted to the above-described embodiments, and various changes and modifications are possible without departing from the spirit of the invention.

As explained above, according to the present invention, by providing, between a word line and a common discharging current source, means for blunting changes in the current flowing through the word lines, the double selection of word lines can be prevented, thereby ensuring the selection of a memory cell in a word-line discharging circuit of a static-type semiconductor memory device.

I claim:

1. A word-line discharging circuit in a static-type semiconductor memory device, operatively connectable to a voltage source, said static-type semiconductor memory device including a plurality of word line and hold line pairs, a plurality of memory cells, respectively, operatively connected between said plurality of word line and hold line pairs, and plurality of holding current sources, respectively, operatively connected between said hold lines of said plurality of word line and hold line pairs and the voltage source, for continually drawing holding currents from said word lines through said memory cells to said hold lines, said word lines discharging circuit comprising:

first transistors having respective bases, respectively, operatively connected to said word lines of said plurality of word line and hold line pairs, said first transistors comprising PNP transistors having respective emitters operatively connected to said corresponding word lines, and having collectors respectively, operatively connected to said bases, for detecting changes in the electric potential of said respective word lines and generating first output signals;

time-constant circuits, respectively, operatively connected to said first transistors, for delaying the first output signals of said PNP transistors and generating second output signals;

a common discharging current source;

second transistors, respectively, operatively connected between said hold lines and said common discharging current source, said second transistors each having a collector operatively connected to said corresponding hold line, a base operatively connected to receive the second output signal of said corresponding time-constant circuits, and an emitter operatively connected to said common discharging current source, said second transistors being switched ON and OFF in response to the second output signals of said time-constant circuits; and means, respectively, operatively connected between said word lines and said common discharging current source, for slowing the rate of change in the current flowing through said word lines, said means comprising said PNP transistors.

2. A word-line discharging circuit as set forth in claim 1, wherein said second transistors are NPN transistors, and wherein said means for slowing the rate of change of the current flowing through said word lines further comprises a resister operatively connected between the emitter of each of said second NPN transistors and said common discharging current source.

3. A word-line discharging circuit as set forth in claim 1, wherein said time constant circuits each have an output terminal, wherein said second transistors are NPN transistors each having a collector operatively connected to said corresponding hold line, an emitter operatively connected to said common discharging current source, and a base, and wherein said means for slowing the rate of change of the current flowing through said word lines further comprises a resistor operatively connected between the base of each of said second NPN transistors and said output terminal of said corresponding time-constant circuit.

4. A word-line discharging circuit in a static-type semiconductor memory device, operatively connectable to a voltage source, said static-type semiconductor memory device including a plurality of word line and hold line pairs, a plurality of memory cells, respectively, operatively connected between said plurality of word line and hold line pairs, and a plurality of holding current sources, respectively, operatively connected between said hold lines of said plurality of word-line and hold line pairs and the voltage source, for continually drawing holding currents from said word lines through said memory cells to said hold lines, said word line discharging circuit comprising:

first transistors having respective bases, respectively, operatively connected to said word lines of said plurality of word line and hold line pairs, for detecting changes in the electric potentials of said respective word lines and generating first output signals;

time-constant circuits, respectively, operatively connnected to said first transistors, for delaying the first output signals of said first transistors and generating second output signals;

a common discharging current source;

second transistors, respectively, operatively connected between said hold lines and said common discharging current source, said second transistors comprising NPN transistors each having a collector operatively connected to said corresponding hold line, having a base operatively connected to receive the second output signal of said corresponding time-constant circuits, and having an emitter operatively connected to said common discharging current source, said NPN transistors being switched ON and OFF in response to the second output signals of said time-constant circuits; and means, respectively, operatively connected between said word lines and said common discharging current source, for slowing the rate of change in the current flowing through said word lines, said means comprising said NPN transistors.

* * * * *